(12) United States Patent
Wu

(10) Patent No.: US 12,364,014 B2
(45) Date of Patent: Jul. 15, 2025

(54) ARRAY SUBSTRATE, MANUFACTURING METHOD THEREOF, AND DISPLAY PANEL

(71) Applicant: GUANGZHOU CHINA STAR OPTOELECTRONICS SEMICONDUCTOR DISPLAY TECHNOLOGY CO., LTD., Guangdong (CN)

(72) Inventor: Wei Wu, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 549 days.

(21) Appl. No.: 17/781,270

(22) PCT Filed: May 13, 2022

(86) PCT No.: PCT/CN2022/092684
§ 371 (c)(1),
(2) Date: May 31, 2022

(87) PCT Pub. No.: WO2023/206621
PCT Pub. Date: Nov. 2, 2023

(65) Prior Publication Data
US 2023/0343790 A1 Oct. 26, 2023

(30) Foreign Application Priority Data
Apr. 24, 2022 (CN) .................... CN202210458525.4

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0221* (2025.01); *H10D 86/411* (2025.01)

(58) Field of Classification Search
CPC ............... H01L 21/02365; H01L 21/77; H01L 21/02244; H01L 21/76877; H01L 27/1218;
(Continued)

(56) References Cited

U.S. PATENT DOCUMENTS

| 7,674,650 B2 * | 3/2010 | Akimoto ........... H01L 29/78693 |
| | | 257/E21.349 |
| 2007/0072439 A1 * | 3/2007 | Akimoto ............. H01L 27/1225 |
| | | 438/795 |
| 2011/0180802 A1 | 7/2011 | Morosawa et al. |

FOREIGN PATENT DOCUMENTS

| CN | 101685835 A | 3/2010 |
| CN | 202423298 U | 9/2012 |
| CN | 213660407 U | 7/2021 |

OTHER PUBLICATIONS

International Search Report issued in corresponding International application No. PCT/CN2022/092684, mailed on Dec. 15, 2022, 8 pages, English translation provided.
(Continued)

*Primary Examiner* — Nikolay K Yushin
(74) *Attorney, Agent, or Firm* — HSML P. C.

(57) ABSTRACT

Embodiments of the present disclosure are directed to an array substrate, a manufacturing method thereof, and a display panel. The array substrate includes a substrate layer, a gate layer, a first insulation layer, a second insulation layer, an active layer and a source-drain layer. The gate layer is disposed on a substrate layer. The first insulation layer is disposed on the substrate layer and covers the gate layer. The second insulation layer is disposed on a surface of the first insulation layer away from the gate layer. The active layer is
(Continued)

disposed on a surface of the second insulation layer away from the first insulation layer. The source-drain layer is disposed on the first insulation layer and electrically connected to the active layer. A material of the first insulation layer comprises a silicon nitride, and a material of the second insulation layer comprises a silicon oxide.

14 Claims, 3 Drawing Sheets

(51) Int. Cl.
    *H10D 86/40*     (2025.01)
    *H10D 86/60*     (2025.01)

(58) Field of Classification Search
    CPC ... H01L 27/12; H01L 27/127; H01L 27/1225; H01L 29/66969; H01L 29/66; H01L 29/7869; H01L 29/786; H01L 27/12485; H10D 86/60; H10D 86/0221; H10D 86/01; H10D 86/411; H10D 86/40; H10D 86/451; H10D 86/423; H10D 30/6755; H10D 30/67; H10D 30/477; H10D 30/0321; H10D 99/00
    See application file for complete search history.

(56) References Cited

OTHER PUBLICATIONS

Written Opinion of the International Search Authority issued in corresponding International application No. PCT/CN2022/092684, dated Dec. 15, 2022, 10 pages, English translation provided.

* cited by examiner

ARRAY SUBSTRATE, MANUFACTURING METHOD THEREOF, AND DISPLAY PANEL

FIELD OF THE INVENTION

The present disclosure relates to the field of display apparatus, more particularly, to an array substrate, a manufacturing method thereof, and a display panel.

BACKGROUND

As a display panel develops in the direction of large size, high resolution, high frequency, and self-luminous display mode, higher and higher requirements are put forward for the mobility and stability of a thin film transistor (TFT) of the control switch and driven display. At present, amorphous silicon TFT commonly used in the display industry has low mobility and low on-state current (Ion), which can not meet the needs of high-level display products. Specifically manifested as an insufficient charge of liquid-crystal display (LCD) panel or insufficient brightness of self-luminous display panel. As the mobility of metal oxide TFT is 10-100 times higher than that of amorphous silicon TFT, it can meet the needs of new high-level display products, so the metal oxide TFT and display panels thereof are getting more and more attention in the industry.

However, due to hydrogen atoms in silicon nitride can reduce the electrical resistivity of oxide semiconductor material, the properties of metal oxide TFT are affected. Therefore, during the production process of the oxide array substrate, silicon oxide is generally used as the contact portion between the gate insulation layer and the oxide layer.

However, it also brings a problem at the same time. The adhesion between the metal layer served as a data line route and the silicon oxide is poor, it is easy to cause disconnection of the data line in the subsequent etching process, especially in the climbing of the gate line. This abnormality greatly affects the production yield rate of the oxide display panel and increases the production cost.

SUMMARY

Technical Problem

The present disclosure is provided an array substrate, a manufacturing method thereof, and a display panel to solve the technical problems of low production yield rate and high production cost of the display panel in the prior art.

Technical Solution

One embodiment of the present disclosure is directed to an array substrate. The array substrate comprises a substrate layer, a gate layer, a first insulation layer, a second insulation layer, an active layer, and a source-drain layer. The gate layer is disposed on the substrate layer. The first insulation layer is disposed on the substrate layer and covers the gate layer. The second insulation layer is disposed on a surface of the first insulation layer away from the gate layer. The active layer is disposed on a surface of the second insulation layer away from the second insulation layer. The source-drain layer is disposed on the first insulation layer and electrically connected to the active layer. A material of the first insulation layer comprises a silicon nitride, and a material of the second insulation layer comprises a silicon oxide.

Furthermore, a width of the second insulation layer is less than a width of the first insulation layer.

Furthermore, an orthographic projection of the active layer on the substrate layer falls into an orthographic projection of the second insulation layer on the substrate layer.

Furthermore, the source-drain layer extends from the surface of the first insulation layer away from the gate layer, through a side edge of the active layer, to a top surface of the active layer.

Furthermore, the array substrate further includes a protective layer, disposed on the first insulation layer and covering an exposed surface of the source-drain layer and the active layer.

One embodiment of the present disclosure is further directed to a manufacturing method thereof. The manufacturing method comprises: forming a gate layer on a substrate layer; forming a first insulation layer covering the gate layer on the substrate layer; forming a second insulation layer on a surface of the first insulation layer away from the gate layer; forming an active layer on a surface of the second insulation layer away from the first insulation layer; and forming a source-drain layer on the first insulation layer and the active layer. A material of the first insulation layer comprises a silicon nitride, and a material of the second insulation layer comprises a silicon oxide.

Furthermore, the second insulation layer and the active layer are formed at the same time through the same photo-etching process on the first insulation layer.

Furthermore, the step of forming the second insulation layer and the active layer at the same time on the first insulation layer comprises: forming a silicon oxide layer on the surface of the first insulation layer away from the gate layer; forming a semiconductor layer on a surface of the silicon oxide layer away from the first insulation layer; coating a photoresist material on a surface of the semiconductor layer away from the silicon oxide layer; forming a photoresist layer by patterning the photoresist material; patterning the semiconductor layer and the silicon oxide layer through the photoresist layer to form the active layer and the second insulation layer; and removing the photoresist layer.

Furthermore, the method further comprises forming a protective layer on the first insulation layer and covering the source-drain layer and the active layer.

One embodiment of the present disclosure is further directed to a display panel. The display panel comprises an array substrate as described above and a luminous layer disposed on the array substrate.

Advantageous Effect

The advantage of the present disclosure is that: the array substrate and the manufacturing method thereof of the present disclosure make the source-drain layer contact with the first insulation layer prepared with silicon nitride, thereby increasing the adhesion between the source-drain layer and a substrate film, reducing the risk of wire breakage of the source-drain layer, and then improving the production yield rate and reducing the production cost. At the same time, the second insulation layer made of silicon oxide is disposed between the first insulation layer and the active layer to prevent hydrogen atoms in the first insulation layer from affecting the electrical resistivity of the active layer, thereby prolonging the life time of the display panel.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

Figure 1:
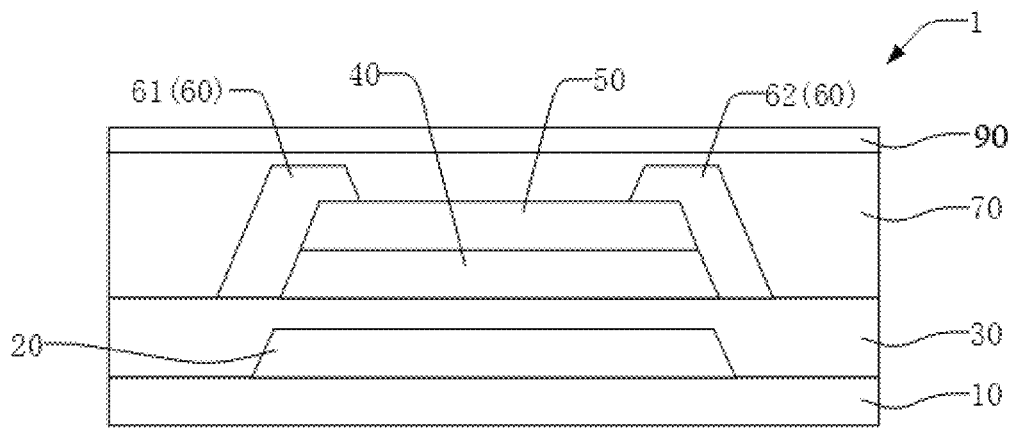
FIG. 1 is a layered structure diagram of an array substrate according to one embodiment of the present disclosure.

| Reference signs illustrated in FIGS. are explained as follows: | | | |
|---|---|---|---|
| Array substrate | 1; | Substrate layer | 10; |
| Gate layer | 20; | First insulation layer | 30; |
| Second insulation layer | 40; | Active layer | 50; |
| Source-drain layer | 60; | Source layer | 61; |
| Drain layer | 62; | Protective layer | 70; |
| Silicon oxide layer | 40'; | Semiconductor layer | 50'; |
| Photoresist layer | 80 | | |

DESCRIPTION OF THE EMBODIMENTS

The following reference to the accompanying drawings of the present disclosure introduces preferred embodiments of the present disclosure, proving that the present disclosure may be implemented, the embodiment of the invention may be a complete introduction to those skilled in the art of the present disclosure, so that its technical content is more clear and easy to understand. The present disclosure may be embodied by many different forms of embodiments of the present disclosure, the scope of protection of the present disclosure is not limited to the embodiments referred to herein.

In the drawings, the member of the same structure is represented by the same numerical designation, and the components of similar structure or function throughout are represented by similar numerical labels. The size and thickness of each member shown in the drawings are arbitrarily shown, the present disclosure does not limit the size and thickness of each component. In order to make the diagram clearer, there are some places in the accompanying drawings that appropriately exaggerate the thickness of the component.

Further, the description of each embodiment of the following invention is a reference to an additional illustration to illustrate a particular embodiment of the invention may be used to implement the present disclosure. The directional terms referred to in the present disclosure, e.g., "up", "down", "front", "back", "left", "right", "inside", "outside", "side", etc., are only directions with reference to additional schemas. Accordingly, the directional terms used are used to better and more clearly illustrate and understand the present disclosure, rather than indicating or implying that the means or elements referred to must have a particular orientation, constructed and operated in a particular orientation, and therefore cannot be construed as a limitation of the present disclosure. In addition, the terms "first", "second", "third", etc. are used only for descriptive purposes and cannot be construed as indicating or implying relative importance.

When some parts are described as "on" another part," the part can be placed directly on the other part. There may also be an intermediate member, the member is placed on the intermediate member, and the intermediate member is placed on another member. When a part is described as "installed to" or "connected to" another part, both can be understood as directly "installed" or "connected", or a part indirectly "installed to" through an intermediate component, or "connected to" another part.

One embodiment of the present disclosure is directed to a display panel. The display panel comprises an array substrate 1 and a luminous layer 90 disposed on the array substrate 1. A plurality of light emitting devices are disposed in the luminous layer 90. The light emitting devices are electrically connected with thin film transistors in the array substrate 1. Specifically, the light emitting device may be one of self-luminous device, such as organic light-emitting diode (OLED), mini light-emitting diode (Mini-LED), and micro light-emitting diode (Micro-LED).

The array substrate 1 is disposed of a plurality of thin film transistors. As shown in FIG. 1, each of the thin film transistors comprises a substrate layer 10, a gate layer 20, a first insulation layer 30, a second insulation layer 40, an active layer 50, a source-drain layer 60, and a protective layer 70.

The substrate layer 10 can be either a flexible or rigid substrate. When the substrate layer 10 is the flexible substrate, the material thereof may contain polyimide (PI), and the display panel is capable of achieving flexible bending display. When the substrate layer 10 is the rigid substrate layer 10, the material thereof may contain at least one of rigid base materials, such as glass and quartz, and the rigid substrate layer 10 is capable of providing rigid support for the display panel.

The gate layer 20 is disposed on a top surface of the substrate layer 10. The first insulation layer 30 is also disposed on the top surface of the substrate layer 10 and covers the gate layer 20. The second insulation layer 40 is disposed on a surface of the first insulation layer 30 away from the substrate layer 10. The active layer 50 is disposed on a surface of the second insulation layer 40 away from the first insulation layer 30 and corresponds to the gate layer 20. The source-drain layer 60 is disposed on a surface of the first insulation layer 30 away from the gate layer 20 and extends from a side surface of the second insulation layer 40 to a top surface of the active layer 50, thereby electrically connecting to the active layer 50. The protective layer 70 is disposed on the first insulation layer 30 and covers an exposed surface of the source-drain layer 60 and the active layer 50. The source-drain layer 60 comprises a source layer 61 and a drain layer 62. The source layer 61 and the drain layer 62 are correspondingly disposed at two sides of the active layer 50.

When the gate layer 20 is passing into current and voltage, it generates an electric field which causes the induced charges to be generated on a surface of the active layer 50 and changes the width of a channel portion in the active layer 50, thereby achieving the goal of controlling the current in the source-drain layer 60. The light emitting devices of the luminous layer 90 are electrically connected to the source-drain layer 60, and the active layer 50 controls the brightness and darkness of the light emitting devices through controlling the current of the source-drain layer 60. The first insulation layer 30, the second insulation layer 40, and the protective layer 70 are used to insulate and protect a conductive structure in the array substrate 1.

The gate layer 20 and the source-drain layer 60 contain conductive metals, which may be single metal material or alloy materials with excellent conductive properties, such as molybdenum (Mo), aluminum (Al), copper (Cu), titanium (Ti), and nickel (Ni). The active layer 50 contains an oxide semiconductor material, which may be one of metal oxides, such as indium gallium zinc oxide (IGZO), indium zinc tritium oxide (IZTO), and indium gallium zinc tritium oxide (IGZTO). The first insulation layer 30 is made of silicon nitride, and the second insulation layer 40 is made of silicon oxide. The material of the protective layer 70 comprises at least one in a group of the silicon nitride, silicon oxide, aluminum oxide, and hafnium oxide.

Due to the adhesion between the metal material and the silicon oxide is poor, the source-drain layer 60 disposed on the first insulation layer 30 made of silicon nitride is capable of improving the adhesion between the source-drain layer 60 and the substrate film, and reduces the contact area between the source-drain layer 60 and the second insulation layer 40 at the same time, thereby reducing the risk of wire breakage of the source-drain layer 60, and then improving the production yield rate of the display panel and reducing the production cost.

However, hydrogen atoms in silicon oxide is easy to cause the electrical resistivity of oxide semiconductor material in the active layer 50 to decrease, thereby affecting the luminescent display of the entire display panel. Therefore, the second insulation layer 40 made of silicon oxides is disposed between the active layer 50 and the first insulation layer 30 can block hydrogen atoms in the first insulation layer 30, thereby prolonging the life time of the active layer 50.

Further, a width of the second insulation layer 40 is less than a width of the first insulation layer 30. An orthographic projection of the active layer 50 on the substrate layer 10 falls into an orthographic projection of the second insulation layer 40 on the substrate layer 10, that is, a width of the active layer 50 is less than or equal to the width of the first insulation layer 30. The source-drain layer 60 starts from the surface of the first insulation layer 30 away the gate layer 20, passes through a side surface of the second insulation layer 40, a top surface of the second insulation layer 40 (which is a surface of the second insulation layer 40 toward the active layer 50), and a side surface of the active layer 50 in turn, and extends toward a top surface of the active layer 50 (which is a surface of the second insulation layer 40 away from the active layer 50), thereby achieving electrical connection between the source-drain layer 60 and the active layer 50.

The width of the active layer 50 is equal to the width of the second insulation layer 40, so that a side surface of the active layer 50 and a side surface of the second insulation layer 40 are in the same plane. The source-drain layer 60 can extend directly from the side surface of the second insulation layer 40 to the side surface of the active layer 50, it reduces the climbing distance of the source-drain layer 60, thereby reducing the material of the source-drain layer 60 and reducing production cost. At the same time, reducing the climbing distance of the source-drain layer 60 can also reduce the contact area between the source-drain layer 60 and the second insulation layer 40, thereby further improving the production yield rate of the display panel.

Figure 2:
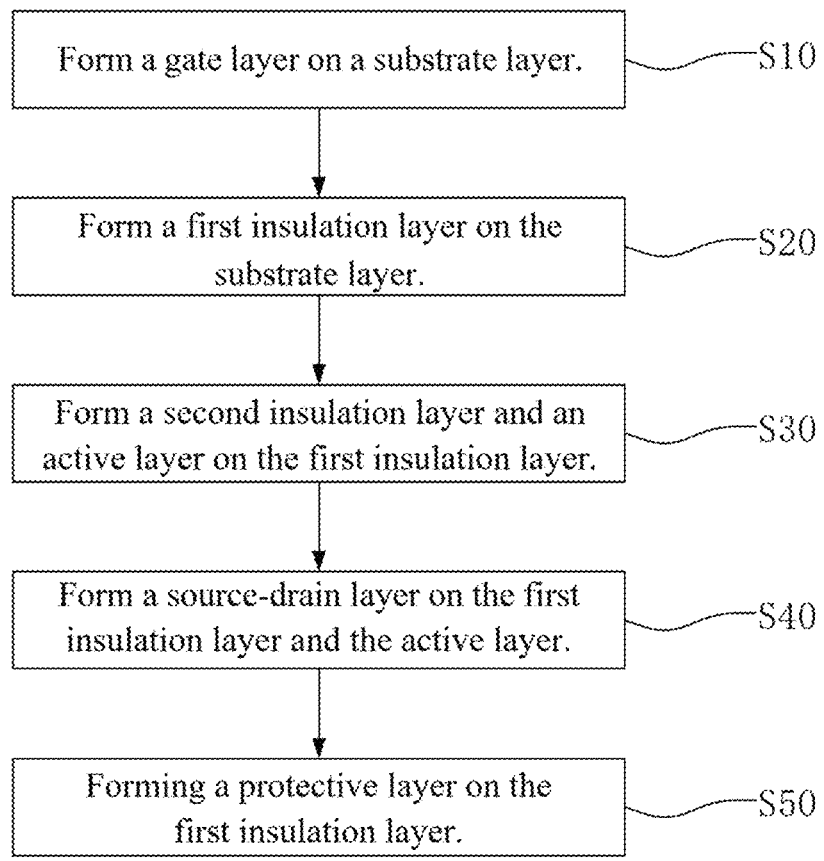
FIG. 2 is a flowchart of a manufacturing method of the array substrate according to one embodiment of the present disclosure.

One embodiment of the present disclosure is further directed to a manufacturing method of the array substrate 1. The implementation process of the method is shown in FIG. 2, which comprises the steps S10-S50.

Figure 3:
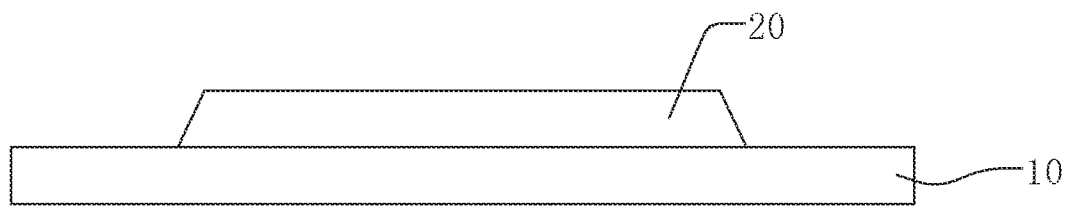
FIG. 3 is a layered structure diagram of the step S10 of forming a gate layer according to one embodiment of the present disclosure.

At step S10 of forming a gate layer 20 on a substrate layer 10, a layer of metal material is deposited on one surface of the substrate layer 10, and the layer of metal material is patterned to form the gate layer 20 as shown in FIG. 3.

Figure 4:
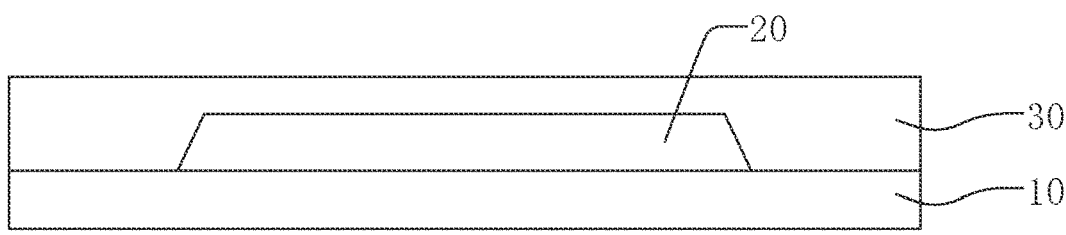
FIG. 4 is a layered structure diagram after the step S20 of forming a first insulation layer according to one embodiment of the present disclosure.

At step S20 of forming a first insulation layer 30 on the substrate layer 10, a layer of silicon nitride covering the gate layer 20 is deposited on the substrate layer 10 to form the first insulation layer 30 as shown in FIG. 4.

Figure 5:
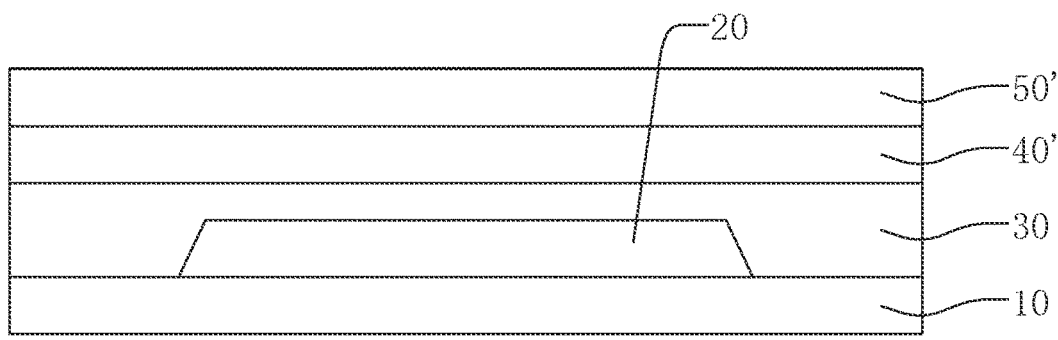
FIG. 5 is a layered structure diagram after the step S30 of forming a silicon oxide layer and a semiconductor layer according to one embodiment of the present disclosure.
Figure 6:
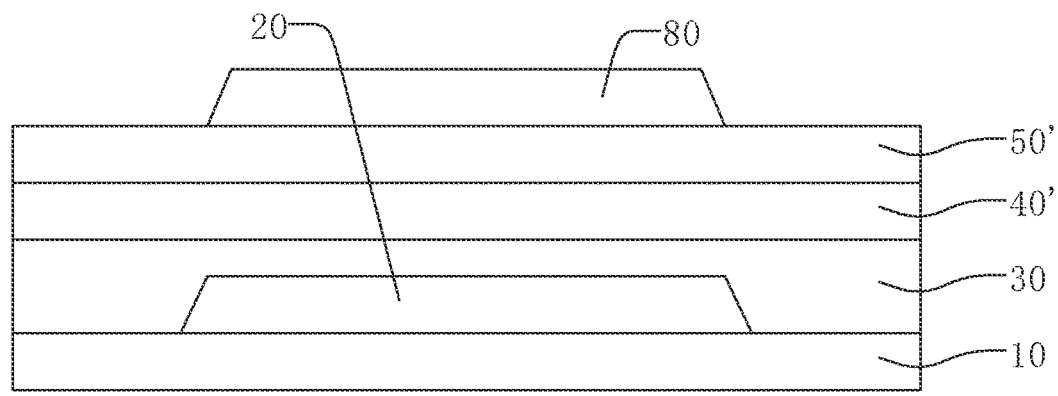
FIG. 6 is a layered structure diagram after the step S30 of forming a photoresist layer according to one embodiment of the present disclosure.
Figure 7:
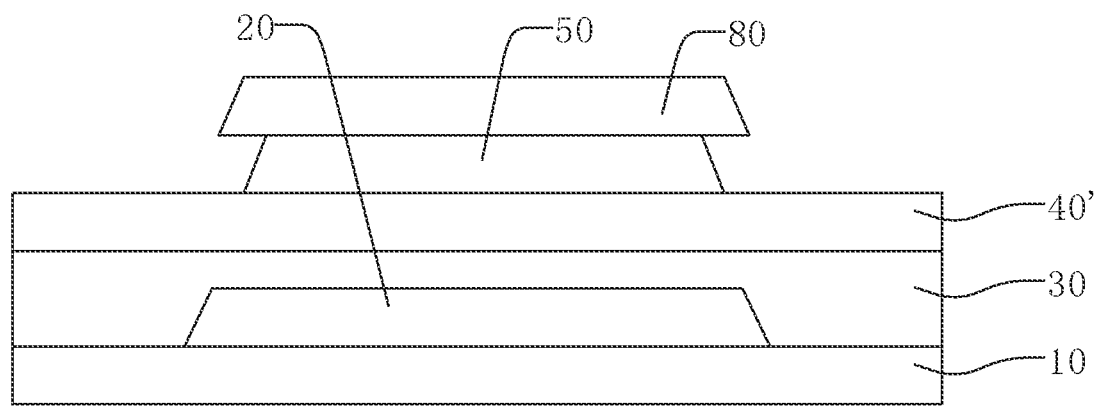
FIG. 7 is a layered structure diagram after the step S30 of forming an active layer according to one embodiment of the present disclosure.
Figure 8:
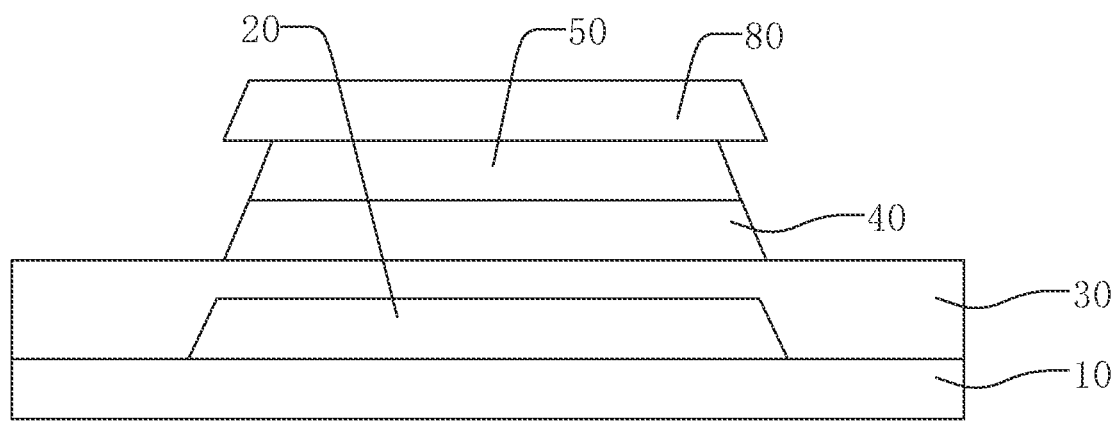
FIG. 8 is a layered structure diagram after the step S30 of forming a second insulation layer according to one embodiment of the present disclosure.

At step S30 of forming a second insulation layer 40 and an active layer 50 on the first insulation layer 30, a layer of silicon oxide and a layer of oxide semiconductor material are deposited in turn on a surface of the first insulation layer 30 away from the gate layer 20 to form a silicon oxide layer 40' and a semiconductor layer 50' as shown in FIG. 5. A layer of photoresist material is coated on a surface of the semiconductor layer 50' away from the silicon oxide layer 40', and the layer of photoresist material is patterned through exposure process and developing process to form a photoresist layer 80 corresponding to the gate layer 20 as shown in FIG. 6. The semiconductor layer 50' uncovered by the photoresist layer 80 is etched and removed, thereby patterning the semiconductor layer 50' to form an active layer 50 as shown in FIG. 7. The silicon oxide layer 40' uncovered by the photoresist layer 80 is etched and removed again through the photoresist layer 80, thereby patterning the silicon oxide layer 40' to form the second insulation layer 40 as shown in FIG. 8. The photoresist layer 80 is removed.

Figure 9:
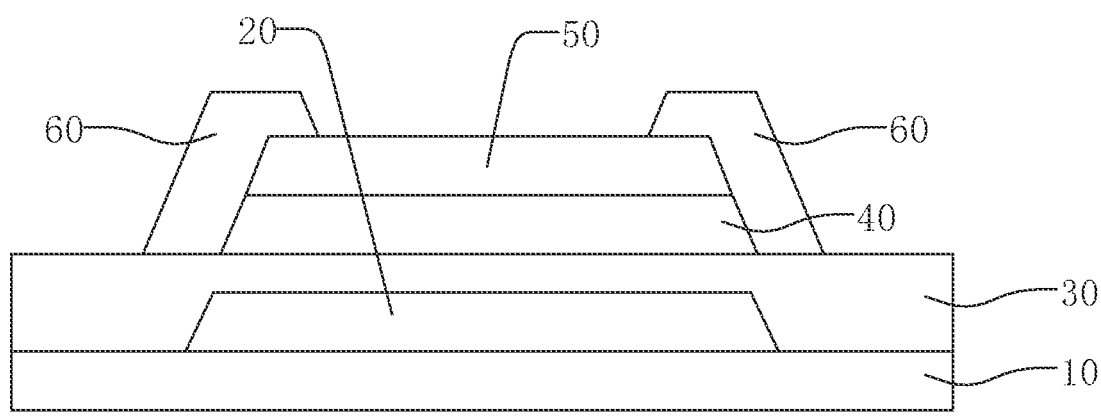
FIG. 9 is a layered structure diagram after the step S40 of forming a source-drain layer according to one embodiment of the present disclosure.

At step S40 of forming a source-drain layer 60 on the first insulation layer 40 and the active layer 50, a layer of metal material covering the active layer 50 is deposited on the first insulation layer 30, and the layer of metal material is patterned to form the source-drain layer 60 as shown in FIG. 9.

At step S50 of forming a protective layer 70 on the first insulation layer 30, the source-drain layer 60, and the active layer 50: a layer of insulating material covering the source-drain layer 60 and the active layer 50 is deposited on the first insulation layer 30 to form the protective layer 70 as shown in FIG. 1. The insulating material can be at least one in a group of silicon nitride, silicon oxide, aluminum oxide, and hafnium oxide.

The array substrate and the manufacturing method thereof of the present disclosure make the source-drain layer contact with the first insulation layer prepared with silicon nitride, thereby increasing the adhesion between the source-drain layer and a substrate film, reducing the risk of wire breakage of the source-drain layer, and then improving the production yield rate and reducing the production cost. At the same time, the second insulation layer made of silicon oxide is disposed between the first insulation layer and the active layer to prevent hydrogen atoms in the first insulation layer from affecting the electrical resistivity of the active layer, thereby prolonging the life time of the display panel.

Although reference is made herein to specific embodiments to describe the present disclosure, it should be understood that these embodiments are merely examples of the principles and applications of the present disclosure. It should therefore be understood that many modifications may be made to exemplary embodiments, and other arrangements may be designed, as long as they do not deviate from the spirit and scope of the present disclosure as defined by the appended claims. It should be understood that different dependent claims and features described herein may be combined in a manner different from those described in the original claims. It will also be appreciated that the features described in conjunction with a separate embodiment may be used in other embodiments.

What is claimed is:

1. An array substrate, comprising:
    a substrate layer;
    a gate layer, disposed on the substrate layer;
    a first insulation layer, disposed on the substrate layer and covering the gate layer;
    a second insulation layer, disposed on a surface of the first insulation layer away from the gate layer;
    an active layer, disposed on a surface of the second insulation layer away from the first insulation layer; and
    a source-drain layer, disposed on and in contact with the first insulation layer and electrically connected to the active layer;
    wherein a material of the first insulation layer comprises a silicon nitride, and a material of the second insulation layer comprises a silicon oxide.

2. The array substrate as claimed in claim 1, wherein a width of the second insulation layer is less than a width of the first insulation layer.

3. The array substrate as claimed in claim 1, wherein an orthographic projection of the active layer on the substrate layer falls into an orthographic projection of the second insulation layer on the substrate layer.

4. The array substrate as claimed in claim 1, wherein the source-drain layer extends from the surface of the first insulation layer away from the gate layer, through a side edge of the active layer, to a top surface of the active layer.

5. The array substrate as claimed in claim 1, which further comprising:
    a protective layer, disposed on the first insulation layer and covering an exposed surface of the source-drain layer and the active layer.

6. A method for manufacturing an array substrate, comprising:
    forming a gate layer on a substrate layer;
    forming a first insulation layer covering the gate layer on the substrate layer;
    forming a second insulation layer on a surface of the first insulation layer away from the gate layer;
    forming an active layer on a surface of the second insulation layer away from the first insulation layer; and
    forming a source-drain layer on the first insulation layer and the active layer so that the source-drain layer is in contact with the first insulation layer;
    wherein a material of the first insulation layer comprises a silicon nitride, and a material of the second insulation layer comprises a silicon oxide.

7. The method as claimed in claim 6, which further comprising:
    forming a protective layer on the first insulation layer and covering the source-drain layer and the active layer.

8. The method as claimed in claim 6, wherein the second insulation layer and the active layer are formed simultaneously through a same photoetching process on the first insulation layer.

9. The method as claimed in claim 8, wherein the step of forming the second insulation layer and the active layer at the same time on the first insulation layer comprises:
    forming a silicon oxide layer on the surface of the first insulation layer away from the gate layer;
    forming a semiconductor layer on a surface of the silicon oxide layer away from the first insulation layer;
    coating a photoresist material on a surface of the semiconductor layer away from the silicon oxide layer;
    forming a photoresist layer by patterning the photoresist material;
    patterning the semiconductor layer and the silicon oxide layer through the photoresist layer to form the active layer and the second insulation layer; and
    removing the photoresist layer.

10. A display panel, comprising:
    an array substrate, comprising:
        a substrate layer;
        a gate layer, disposed on the substrate layer;
        a first insulation layer, disposed on the substrate layer and covering the gate layer;
        a second insulation layer, disposed on a surface of the first insulation layer away from the gate layer;
        an active layer, disposed on a surface of the second insulation layer away from the first insulation layer; and
        a source-drain layer, disposed on and in contact with the first insulation layer and electrically connected to the active layer; and
    a luminous layer disposed on the array substrate,
    wherein a material of the first insulation layer comprises a silicon nitride, and a material of the second insulation layer comprises a silicon oxide.

11. The display panel as claimed in claim 10, wherein a width of the second insulation layer is less than a width of the first insulation layer.

12. The display panel as claimed in claim 10, wherein an orthographic projection of the active layer on the substrate layer falls into an orthographic projection of the second insulation layer on the substrate layer.

13. The display panel as claimed in claim 10, wherein the source-drain layer extends from the surface of the first insulation layer away from the gate layer, through a side edge of the active layer, to a top surface of the active layer.

14. The display panel as claimed in claim 10, which further comprising:
    a protective layer, disposed on the first insulation layer and covering an exposed surface of the source-drain layer and the active layer.

* * * * *